United States Patent [19]

Mizukami

[11] Patent Number: 4,922,457

[45] Date of Patent: May 1, 1990

[54] SERIAL ACCESS MEMORY SYSTEM PROVIDED WITH IMPROVED CASCADE BUFFER CIRCUIT

[75] Inventor: Takeshi Mizukami, Tokyo, Japan

[73] Assignee: NEC Corporation, Tokyo, Japan

[21] Appl. No.: 306,607

[22] Filed: Feb. 6, 1989

[30] Foreign Application Priority Data

Feb. 4, 1988 [JP] Japan .................................. 63-24893

[51] Int. Cl.⁵ ........................ G11C 7/00; G11C 11/42
[52] U.S. Cl. ........................... 365/189.01; 365/189.03; 365/189.05; 365/221; 365/233; 365/73
[58] Field of Search ...................... 365/189.01, 189.03, 365/189.05, 189.08, 221, 233, 73, 77

[56] References Cited

U.S. PATENT DOCUMENTS

| | | | |
|---|---|---|---|
| 4,222,102 | 9/1980 | Jansen et al. ........................... | 365/73 |
| 4,779,234 | 10/1988 | Kaneko et al. ............. | 365/189.03 X |
| 4,825,415 | 4/1989 | Nakaizumi ...................... | 365/189.05 |
| 4,829,471 | 5/1989 | Banerjee et al. ........... | 365/189.05 X |
| 4,829,475 | 5/1989 | Ward et al. ................ | 365/189.05 X |
| 4,833,655 | 5/1989 | Wolf et al. ............................ | 365/73 |

*Primary Examiner*—Stuart N. Hecker
*Assistant Examiner*—Alyssa H. Bowler
*Attorney, Agent, or Firm*—Sughrue, Mion, Zinn, Macpeak & Seas

[57] ABSTRACT

A serial access memory device with the improved cascade buffer circuit for controlling serial access operation which has a small number of external terminals is disclosed. The cascade buffer circuit includes first and second external terminals, a first control circuit for enabling the memory device to perform write operation and read operation when the level at the first external terminal rises or falls and when the level at the first external terminal falls or rises, respectively and a second control circuit for operatively causing the second external terminal to rise or fall when the memory device completes write operation and causing the second external terminal to fall or rise when the memory device completes read operation, respectively.

3 Claims, 6 Drawing Sheets

SERIAL ACCESS MEMORY SYSTEM PROVIDED WITH IMPROVED CASCADE BUFFER CIRCUIT

BACKGROUND OF THE INVENTION

1. Field of the Invention:

The present invention relates to a serial access memory device, and more particularly to a cascade buffer circuit for a serial access memory system whose word length or bit width can be extend by connecting memories in cascade.

2. Description of the Related Art:

Serial access memory systems such as First-In First-Out (FIFO) memory systems have been utilized in the field of signal processing particularly for signal processing. The serial access memory system is usually comprised of a serial memory section having a plurality of serial access storage locations and a cascade buffer circuit for controlling the operations of the serial memory section and indicating the state of the serial memory section to outside the memory. When a plurality of memories are connected in cascade to extend total word length or bit width, the cascade buffer circuit of the memory of one stage receives a read input control signal or a write input control signal from the previous, lower stage in order to perform a read operation on a operation of the memory of this one stage and produces a read output control signal or a write output control signal of the cascade buffer circuit of the memory in the subsequent stage, upper stage for designating a read or write operation to the memory of the upper stage. Thus, serial read or write operations can be conducted over the plurality of memories connected in cascade. Moreover, it is necessary to indicate a location in the cascade connection of the memories to at least the first or last memory to control start or end of the serial access operations, and a control terminal for inputting this kind of information to the memory, the cascade buffer circuit must be provided with the above control signal. Thus, the cascade buffer circuit of the memory system requires five terminals receiving the write input control signal, read input control signal, the write output control signal, the read output control signal and the signal indicating the location of the memory in the cascade connection.

Thus, the cascade buffer circuit of the memory system in the prior art necessitates five external terminals in a total. Since, the serial access memory section of the memory system needs relatively large number of terminals for fundamental memory action, the addition of the terminals for the cascade buffer circuit results in a considerably large number of terminals. This is large obstacle to reduce the size of the memory device and fabricate a large capacity of memory with a high density structure.

SUMMARY OF THE INVENTION

It is, therefore, an object of the present invention to provide a cascade buffer circuit for the serial access memory system each stage having a reduced number of external terminals.

It is another object of the present invention to provide a serial access memory system which can be fabricated with a reduced size of package.

The serial access memory system according to the present invention comprises a serial access memory section to be accessed serially, a first external terminal receiving an input control signal assuming one of first and second levels, a second external terminal outputting one of the first and second levels, and a cascade buffer circuit coupled to the memory section, the first external and the second external terminals for operatively allowing the memory section to perform one of read and write operations, the cascade buffer circuit including first means for detecting a first change in the input control signal from the first level to the second level to generate a first detection signal, second means for detecting a second change in the input control signal from the second level to the first level to generate a second detection signal, third means coupled to the first means and the memory section for operatively enabling the memory section to perform write operation in response to the first detection signal, fourth means coupled to the memory section and the second means for operatively enabling the memory section to perform read operation in response to the second detection signal, and fifth means coupled to the memory section and the second external terminal, the fifth means operatively causing at the second external terminal the first change when the memory section completes write operation and second change when the memory section completes read operation.

According to the present invention, the first external terminal is used to receive the write indication signal and the read indication signal from the previous stage of memory system, and the write indication signal and the read indication signal are outputted via the second external terminal.

Thus, the above first and second external terminals can be used for serial write and serial read operations in the cascade structure of memory devices to achieve reduction of the external terminals.

BRIEF DESCRIPTION OF THE DRAWINGS

The above and further objects, features and advantages the present invention will become more apparent from the following detailed description taken in conjunction with the accompanying drawings, wherein.

DETAILED DESCRIPTION OF THE INVENTION

Figure 1:
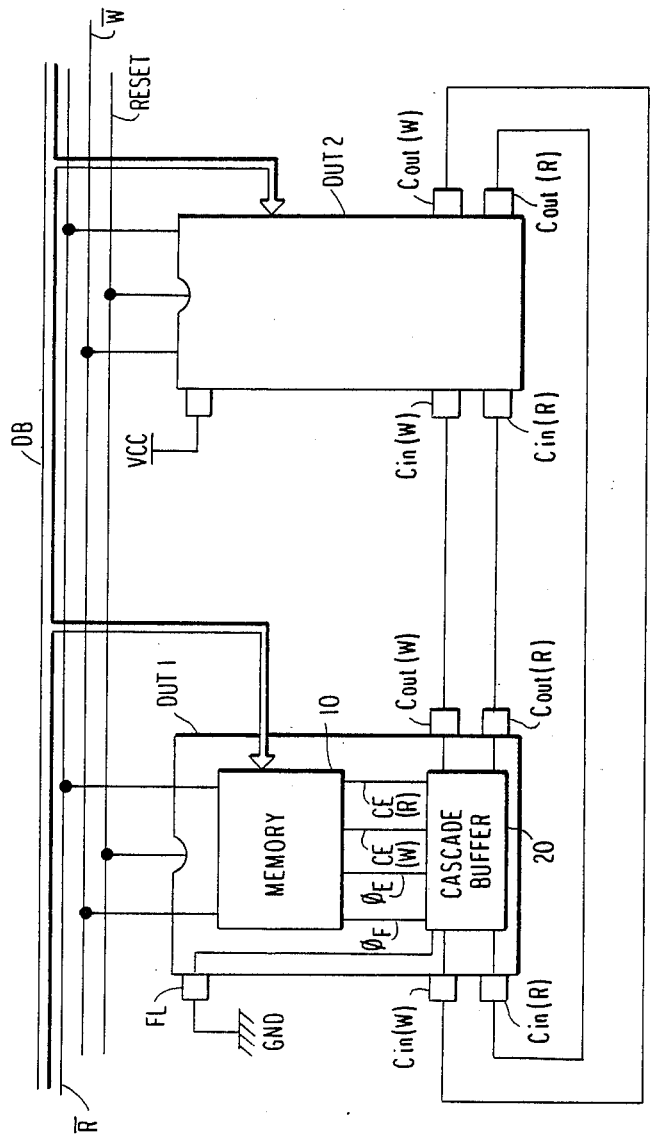
FIG. 1 is schematic block diagram of a memory system employing serial access memories in the prior art.
Figure 2:
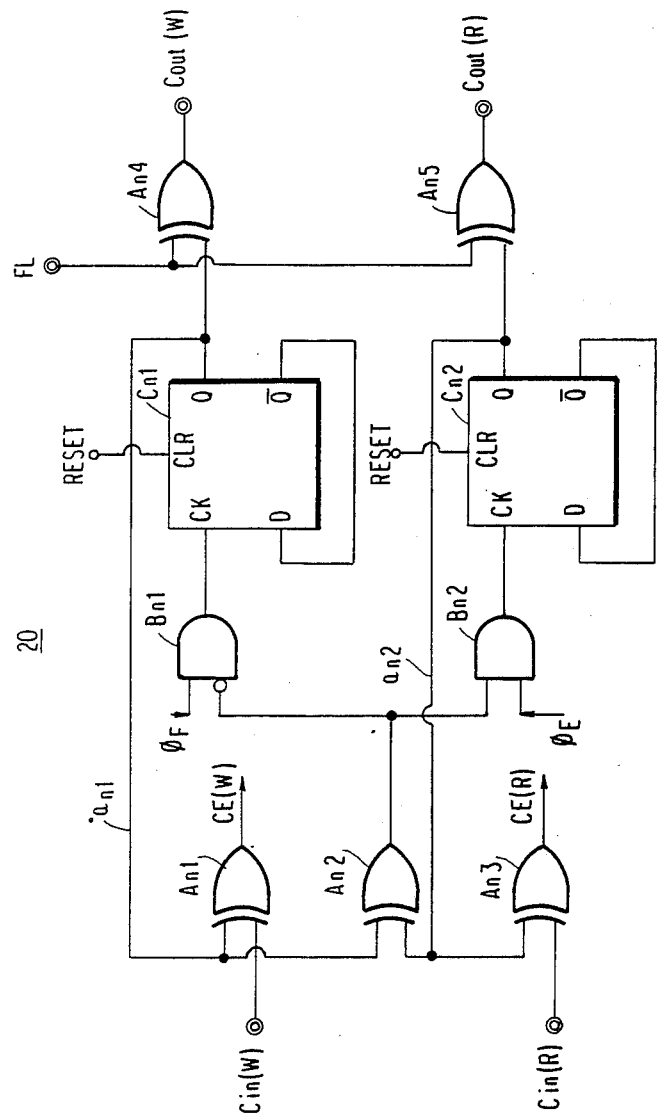
FIG. 2 is a schematic block diagram of the cascade buffer circuit in the prior art.

Prior Art:

With reference to FIGS. 1 and 2, the conventional serial access memory system will be explained.

FIG. 1 shows a serial memory system in which serial access memory devices such as integrated circuit memories DUT1 and DUT2. The serial memory device DUT comprises a serial memory section 10 having a plurality of serial storage locations and a cascade buffer circuit 20 for controlling read and write operations of the memory section 10. The memory section 10 is connected to a data bus DB, a read enable line $\overline{R}$ and a write enable line $\overline{W}$. The cascade buffer circuit 20 is connected to a read input terminal $C_{in}$ (R), for receiving a read indication signal to the memory device DUT1, a write input terminal $C_{in}$ (W) for receiving a write indication signal to DUT1, a read output terminal $C_{out}$ (R) for outputting a read indication signal to the subsequent memory device DUT2, a write output terminal $C_{out}$(W) for outputting a write indication signal to the memory device DUT2, and a location indication terminal FL for indicating to the memory device DUT1 that the memory device DUT1 is located in the start (first)(or last) location in the cascade connection of the devices DUT1 and DUT2. The memory device DUT2 has the same structure as DUT1.

The cascade buffer circuit 20 carries out the input and output operations, and is used to extend the word length or the bit width in, for example, a first-in- first-out memory (FIFO memory). For instance, devices DUT1, DUT2 each of which being constituted by 32 kilowords ×8 bits can be connected in a number of n in series or in parallel (hereinafter referred to as cascade connection) in order to expand the capacity such as (32×n) kilowords ×8 bits or 32 kilowords×(8×n) bits.

A practical example of the cascade buffer circuit 20 will be explained with reference to FIG. 2.

The cascade buffer circuit 20 comprises exclusive OR gates (hereinafter EXOR's) $A_{n1}$, $A_{n2}$, $A_{n3}$, $A_{n4}$ and $A_{n5}$, AND gates $B_{n1}$, $B_{n2}$, and delayed flip-flops $C_{n1}$ and $C_{n2}$. The EXOR's $A_{n1}$ and $A_{n2}$ produce a write enable signal CE(W) for enabling a write operation of the memory section 10 of the same device, and a read enable signal CE(R) for enabling a read operation of the memory section 10 when they are at a high level, respectively. The AND gates $B_{n1}$ and $B_{n2}$ receive an empty signal $\phi_E$ indicating that data of the memory section is empty and a full signal indicating that data of the memory section 10 is full from the memory section, respectively.

Figure 3:
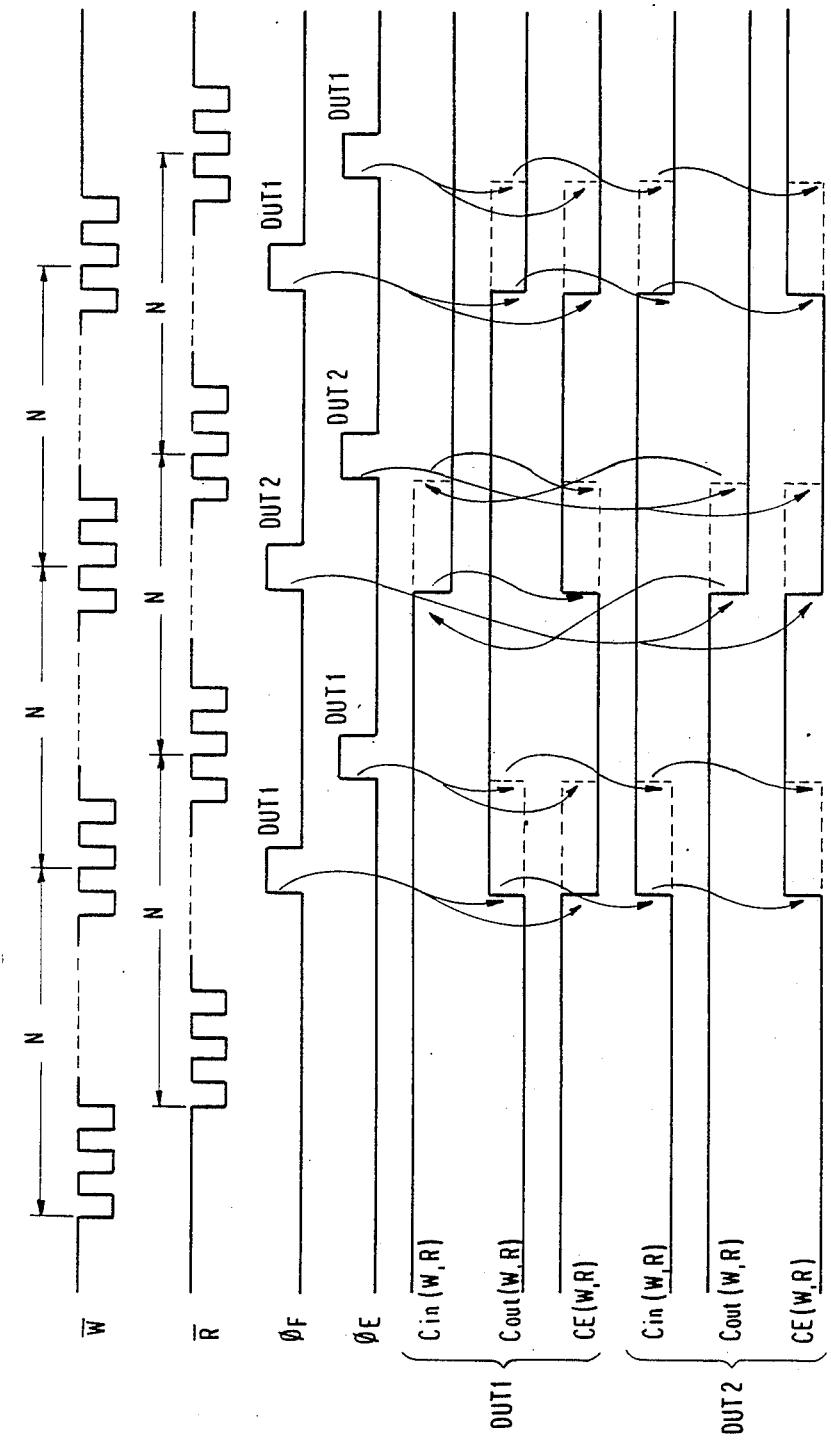
FIG. 3 is a timing diagram showing operations of the system of FIG. 1.

Described below with reference to the timing chart of FIG. 3 is the case where two devices DUT1 and DUT2 are connected in cascade as shown in FIG. 1 and each device DUT1, DUT2 has N serial storage locations.

When connected in cascade, the terminal FL of the device DUT1 is fixed to ground potential (GND) and the terminal FL of the device DUT2 is fixed to a Vcc potential. Therefore, the device next to the device of which the terminal FL is fixed to the Vcc potential becomes a head (start) device; i.e., the device DUT1 becomes a head device in this case. In the following explanation, the elements of DUT1 corresponding to those $A_{n1}$–$A_{n5}$, $B_{n1}$, $B_{n2}$, $C_{n1}$, $C_{n2}$ in FIG. 2 are referenced as $A_{11}$–$A_{15}$, $B_{11}$, $B_{12}$, $C_{11}$, $C_{12}$, respectively by replacing the suffix "n" with "1". Similarly, the elements of DUT are denoted by the suffix "2" in place of "n" of FIG. 2.

The reset signal line RESET is connected to the respective cascade buffer circuits 10 of DUT1 and DUT2. That is, as a reset signal (RESET) is input to D-F/F $C_{11}$, $C_{12}$ and $C_{21}$, $C_{22}$ (n = 1 and 2, hereinafter omitted), only the terminals $C_{out}$(W) and $C_{out}$(R) assume the high level in the device DUT2 of which the terminal FL is fixed to the Vcc potential. At the same time, the terminals $C_{in}$(W) and $C_{in}$(R) of the device DUT1 assume the high level, the EXOR's $A_{11}$ and $A_{13}$ of DUT1 produce outputs of the high level, so that CE(W) and CE(R) in the device DUT1 assume the enabled condition. The writing operation is continued under this condition, and the full signal $\phi_F$ of the device DUT1 is activated to assume the high level at a moment when the final address of the device DUT1 is written. Accordingly, as the AND $B_{11}$ of DUT1 produces the output of the high level causing a clock input CK of the D-F/F $C_{11}$ to change from low level to high level, the output Q is inverted from low to high, and the terminal $C_{out}$(W) assumes the high level due to the low level at the terminal FL. Therefore, the terminal $C_{in}$(W) of DUT2 assumes the high level, the EXOR $A_{21}$ of DUT21 produces an output of the high level and whereby DUT2 enables the writing. At the same time, since the EXOR $A_{11}$ of DUT1 produces an output of the low level, the DUT1 disenables the writing. Next, the wiring operation is continued for the DUT2 in the same manner as described above. At a moment when the final address of the DUT2 is written, the full signal $\phi_F$ is activated in DUT2 to assume the high level, whereby the output of D-F/F $C_{21}$ of DUT2 is inverted and the terminal $C_{out}$(W) of DUT2 assumes the low level. Accordingly, the terminal $C_{in}$(W) of DUT1 assumes the low level and CE(W) of the DUT1 assumes the enabled condition. At the same time, CE(W) of DUT2 assumes the disenabled condition.

In the reading operation, in place of the full signal $\phi_F$ during the writing operation, an empty signal $\phi_E$ is similarly employed, which corresponds to a read signal of the final address, and the principles of other operations are quite the same as those of the aforementioned writing operation.

According to the conventional cascade buffer circuit, however, the writing operation when the devices are connected in cascade and the reading operation are switched based upon signals input to independent terminals requiring a total of five terminals, i.e., input and output terminals for the writing operation, input and output terminals for the reading operation, and a terminal for designating a head device.

Embodiment

Figure 4:
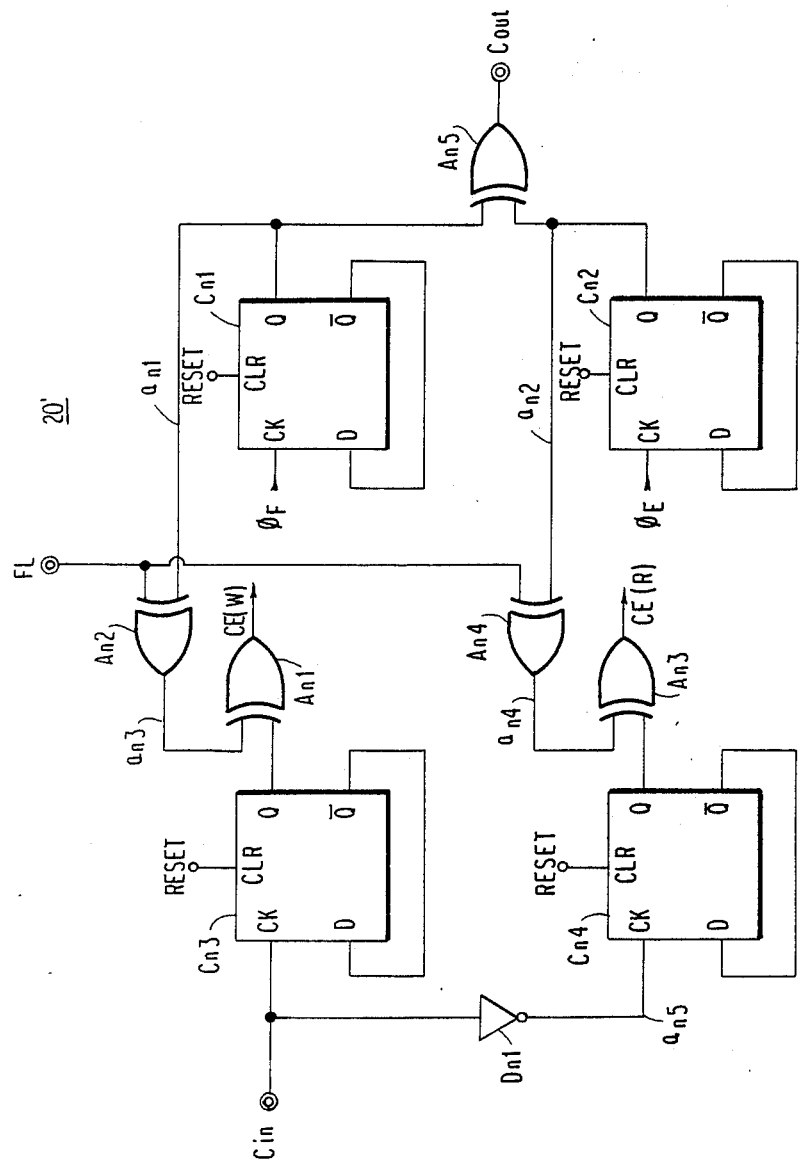
FIG. 4 is a schematic block diagram showing the cascade buffer circuit according to one embodiment of the present invention.

With reference to FIG. 4, the cascade buffer circuit 20' according to one embodiment of the present invention will be explained.

In FIG. 4, the cascade buffer circuit 20' is assumed in n-th memory device in the cascade connection and therefore "n" is employed in the suffixes of the reference codes for the respective elements such as $C_{n1}$.

The cascade buffer circuit 20' comprises EXOR gates $A_{n1}$–$A_{n5}$, delayed flip-flops (D-F/F) $C_{n1}$–$C_{n4}$, an inverter $D_{n1}$ and external terminals $C_{in}$, $C_{out}$ and FL. The reset signal RESET is applied to clear (reset) terminals CLR of the D-F/F's $C_{n1}$–$C_{n4}$. In each of the D-F/F's $C_{n1}$–$C_{n4}$, the complement (inverted) output terminal $\overline{Q}$ is connected to the data input terminal D so that the state of the each D-F/F is inverted each time when the clock terminal CK thereof is activated. The terminal FL is set at a high (Vcc) level when the device is located in head, first location in the cascade connection of the devices and set at a low (ground) level otherwise. The input control terminal $C_{in}$ receives an access indication signal which changes from the low level to the high level in the case of write operation and changes from the high level to the low level in the case of read operation. Similarly, the output control terminal $C_{out}$ generates an access indication signal to the memory device of the upper stage. The access indication signal from $C_{out}$ shows the change of the low level to the high level in the case of write operation and the change of the high level to the low level in the case of read operation. With respect to the case where two memory devices DUT1 and DUT2 employing the cascade buffer circuit of FIG. 4 are connected in cascade is shown in FIG. 5A, operations will be explained below.

Figure 5A:
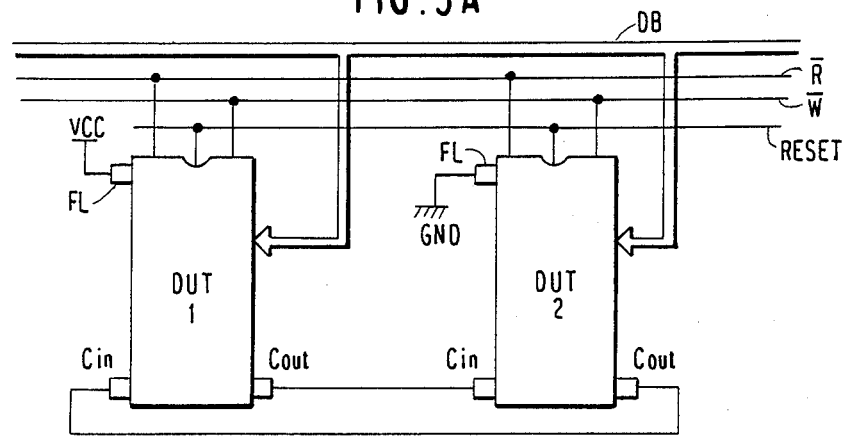
FIG. 5 shows a system having two memory devices connected in cascade.
FIG. 5B shows a system having n memory devices connected in cascade and FIG. 5C shows a case of the single memory device system.
Figure 5B:
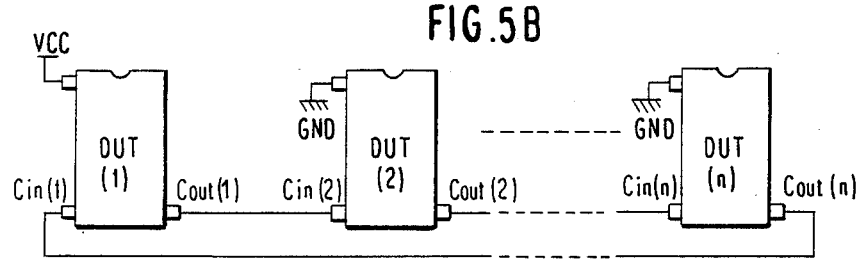

When the two devices DUT1 and DUT2 are connected in cascade as shown in FIG. 5A, the terminal FL of the device DUT1 is connected to the potential Vcc and the terminal FL of the device DUT2 is connected to GND (ground). Therefore, the DUT1 of which the terminal FL is fixed to the potential Vcc becomes a head device.

Figure 6:
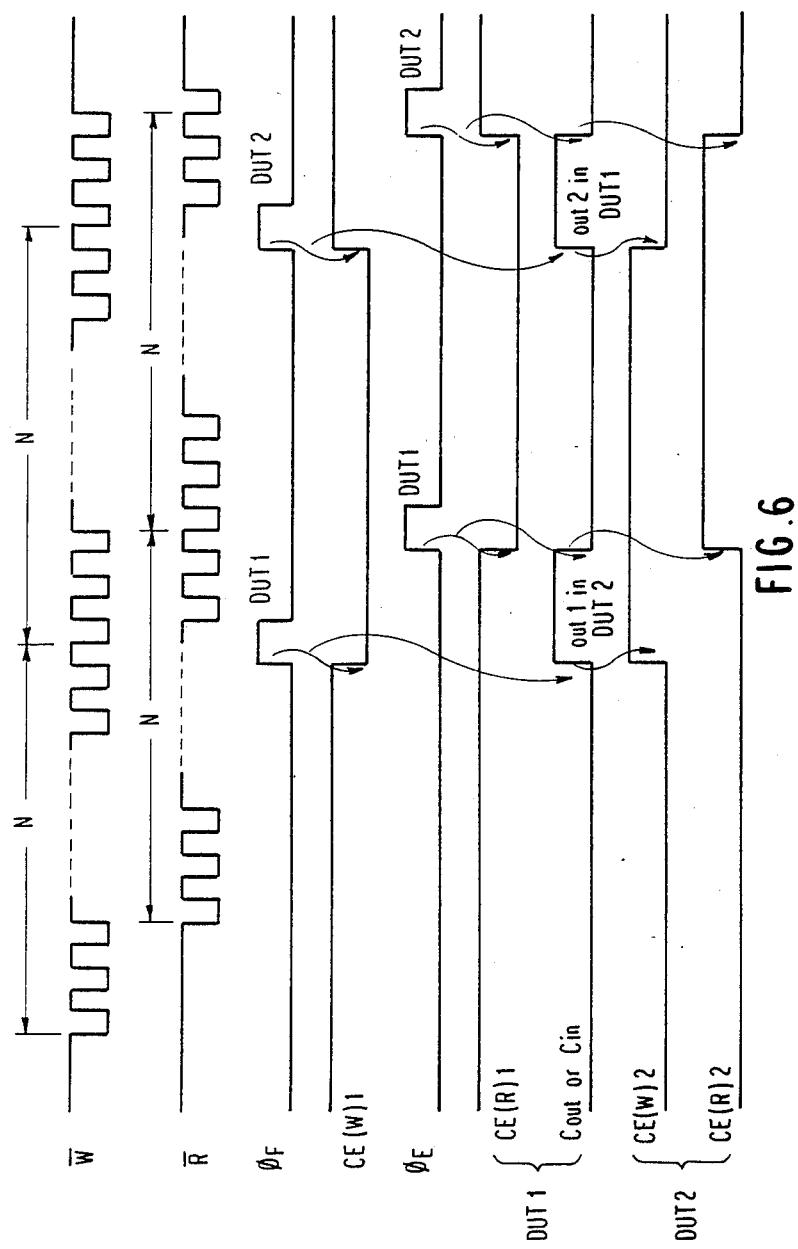
FIG. 6 is a timing diagram showing operation of the system according to the present invention.

The operation will now be described with reference to a timing chart of FIG. 6.

First, as a reset signal RESET is input, the EXOR' gates $A_{12}$ and $A_{14}$ of DUT1 that receive signals of the low level from the terminals Q of D-F/F $C_{11}$ and $C_{12}$ of DUT1 produce outputs $a_{13}$ and $a_{14}$ ($a_{n3}$, $a_{n4}$, n=1) of the high level in the DUT1 of which the terminal FL is fixed to the potential Vcc. Therefore, the write enable signal CE(W) and the read enable signal CE(R) to the memory section 10 (not shown) of DUT1 which are generated from EXOR's $A_{11}$ and $A_{13}$ that receive output of the low level of D-F/F $C_{13}$ and $C_{14}$, are enabled (high level). As the writing operation is continued under this condition and as the full signal $\phi_F$ is activated when the last address of the memory section of DUT1 is accessed, the terminal Q of D-F/F $C_{11}$ assumes the high level and the terminal $C_{out}$ of DUT1 which is the output of EXOR $A_{15}$ assumes the high level. Therefore, the input to D-F/F $C_{23}$ of DUT2 changes from the low level to the high level, so that the signal CE(W) in DUT2 is enabled, while at the same time, the signal CE(W) of DUT1 is disenabled.

With the reading operation being continued under this condition, when an empty signal $\phi_E$ is activated at a moment when the final or last address of DUT1 is read out, the terminal Q of D-F/F $C_{12}$ assumes the high level, and the terminal $C_{out}$ of DUT1 changes into the low level from the high level that had been maintained during the above-mentioned writing operation owing to the output of EXOR $A_{15}$.

Therefore, the input CK (signal $a_{25}$) of D-F/F $C_{24}$ changes from the low level into the high level in the DUT2, and CE(R) of DUT2 is enabled owing to the output of EXOR $A_{23}$ and, at the same time, CE(R) of DUT1 is disenabled.

Figure 5C:
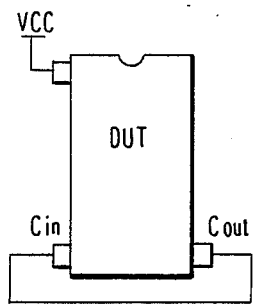

Though the above-mentioned embodiment has dealt with only the case where the two devices are connected in serial cascade, the invention is in no way limited thereto only but also encompasses the case where n devices are connected in series (or in parallel) as shown in FIG. FB and the case where only one device is used as shown on FIG. 5C.

In the case where "n" memory devices are connected in cascade, the above operations explained with reference to FIG. 5A continues in the same way towards the upper stage devices. Owing to the operation same as the aforementioned one, the DUT (n) enables the writing when the terminal $C_{out}$ of DUT (n−1) changes from the low level to the high level and, at the same time, the DUT (n−1) is disenabled. Further, when the terminal $C_{out}$ of DUT (n−1) changes from the high level to the low level, the DUT (n) enables the reading and, at the same time, the DUT (n−1) is disenabled.

According to the cascade buffer circuit of the present invention as described above, the writing operation at the time of connecting the devices in cascade and the reading operation can be switched based on the rise and fall of the input and output signals. Therefore, the write and read control signals can be input and output through the same terminals, contributing to reducing the number of external terminals.

I claim:

1. A serial access memory system comprising a serial access memory section to be accessed serially, a first external terminal receiving an input control signal assuming one of first and second levels, a second external terminal outputting one of said first and second levels, and a cascade buffer circuit coupled to said memory section, said first external and said second external terminals for operatively allowing said memory section to perform one of read and write operations, said cascade buffer circuit including first means for detecting a first change in said input control signal from said first level to said second level to generate a first detection signal, second means for detecting a second change in said input control signal from said second level to said first level to generate a second detection signal, third means coupled to said first means and said memory section for operatively enabling said memory section to perform write operation in response to said first detection signal, fourth means coupled to said memory section and said second means for operatively enabling said memory section to perform read operation in response to said second detection signal, and fifth means coupled to said memory section and said second external terminal, said fifth means operatively causing at said second external terminal said first change when said memory section completes write operation and second change when said memory section completes read operation.

2. The serial access memory system according to claim 1, in which said first means includes a first flip-flop circuit having a clock input connected to said first external terminal, a data input terminal, a true output terminal and a complement output terminal connected to said data input terminal, and said second means includes an inverter having an input connected to said first external terminal, and a second flip-flop having a clock terminal connected to said inverter, a data input terminal, a true output terminal and a complement output terminal connected to said data input terminal of said second flip-flop.

3. The serial access memory system according to claim 1, in which said fifth means includes third and fourth flip-flops each having a clock input terminal, a data input terminal, a true output terminal and a complement output terminal connected to the data input terminal thereof, means for applying a pulse signal to the clock input terminal of said third flip-flop when said memory section completes write operation, means for applying a pulse signal to the clock input terminal of said fourth flip-flop when said memory section completes read operation, and an Exclusive-OR gate having first and second input terminals connected to the true output terminals of said third and fourth flip-flops, respectively and output terminal connected to said second external terminal.

* * * * *